United States Patent
Yun

(10) Patent No.: US 6,808,391 B2
(45) Date of Patent: Oct. 26, 2004

(54) BAKING APPARATUS FOR MANUFACTURING A SEMICONDUCTOR DEVICE

(75) Inventor: Chang-Ju Yun, Suwon (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 10/655,306

(22) Filed: Sep. 5, 2003

(65) Prior Publication Data

US 2004/0048219 A1 Mar. 11, 2004

(30) Foreign Application Priority Data

Sep. 11, 2002 (KR) .......................................... 2002-54913

(51) Int. Cl.$^7$ ................................................. F27D 3/06
(52) U.S. Cl. ....................... 432/249; 432/247; 118/725; 392/416
(58) Field of Search ................................. 432/247, 248, 432/249, 253; 118/715, 725; 219/405; 392/416, 418

(56) References Cited

U.S. PATENT DOCUMENTS

| 5,429,498 | A | * | 7/1995 | Okase et al. ................. 432/152 |
| 6,450,805 | B1 | * | 9/2002 | Oda et al. .................... 432/247 |
| 6,575,739 | B1 | * | 6/2003 | Yoo ............................ 432/239 |
| 2002/0086177 | A1 | | 7/2002 | Hodel et al. |

* cited by examiner

*Primary Examiner*—Gregory Wilson
(74) *Attorney, Agent, or Firm*—Volentine Francos & Wutt, P.L.L.C.

(57) ABSTRACT

A baking apparatus for manufacturing a semiconductor device remarkably enhances the uniformity of the CD (Critical Dimension) of a wafer by creating a uniform temperature distribution. The apparatus includes a processing having an open upper part, a hot plate disposed in the chamber and on which a wafer is to be mounted, a cover covering the upper part of the chamber; and a thin film made of material having a low emissivity extending over the inner surface of the cover. The inventive structure prevents the emission of heat to the outside so that the temperature within the processing chamber can be rapidly stabilized.

9 Claims, 4 Drawing Sheets

T:Top
L:Left
R:Right
F:Flat Zone
C:Center

| MATERIAL | | VERTICAL EMISSIVITY($\varepsilon$) |
|---|---|---|
| ALUMINUM | WELL-POLISHED PLATE | 0.038~0.06 |
| | LIGHTENING FOIL | 0.04 |
| | MUCH OXIDIZED | 0.20~0.33 |
| BRASS | WELL-POLISHED | 0.028~0.031 |
| | BLUNT | 0.22 |
| | OXIDIZED | 0.60 |
| COPPER | POLISHED AND ELECTROLYZED | 0.018 |
| | POLISHED | 0.04~0.05 |
| | ALUMINUM-PLATED | 0.18 |
| | OXIDIZED IN BLACK | 0.78 |
| GOLD POLISHED | | 0.02 |

FIG.5

| TEST NO | TEST CONDITION | CD | | | | | | AVG | RANGE |
|---|---|---|---|---|---|---|---|---|---|
| | | T | L | C | R | F | | | |
| 1 | THE EXISTING | 197 | 201 | 182 | 205 | 210 | | 199 | 23 |
| 2 | STRUCTURAL CHANGE | 215 | 209 | 186 | 229 | 217 | | 211.2 | 43 |
| 3 | STRUCTURAL CHANGE & AL TAPE | 200 | 203 | 208 | 206 | 213 | | 206 | 13 |
| 4 | AL TAPE | 206 | 212 | 209 | 214 | 215 | | 211.2 | 9 |

BAKING APPARATUS FOR MANUFACTURING A SEMICONDUCTOR DEVICE

BACKGROUND OF THE INVENTION

1. Field of the Invention

The present invention relates to the fabrication of semiconductor devices. More specifically, the present invention relates to a baking apparatus having a hot plate in a chamber for baking a semiconductor wafer.

2. Description of the Related Art

In general, high density semiconductor devices have miniaturized circuit patterns whose fabrication requires a rigorous management of parameters that influence the size of the miniaturized pattern. In particular, the operating parameters of a photolithography process directly influence the size of the miniaturized pattern. Such a photolithography process includes steps of depositing a photoresist on a wafer, exposing the deposited photoresist to light through a reticle having a pattern to transcribe the pattern of the reticle onto the photoresist, and developing the exposed photoresist to pattern the photoresist.

The developing process, in turn, includes steps of spraying a developing solution onto the wafer so as to remove the exposed portion of the photoresist and leave the non-exposed portion as a pattern, or conversely, to leave the exposed portion as the pattern and eliminate the non-exposed portion. Then, the residual developing solution is removed by spraying pure water onto the wafer. Next, the wafer is subjected to a post bake in which the wafer is baked at constant temperature.

Such a baking process is generally carried out by a baking device having a chamber, and a hot plate e quipped within the chamber. The wafer on which the photoresist was developed is mounted on the hot plate and baked at a constant temperature. The baking device must bake the photoresist uniformly if a fine pattern is to be ultimately formed using the patterned photoresist as an etch mask, for example.

That is, the speed and manner in which the wafer is brought to a constant baking temperature once the wafer enters the chamber, and the degree to which the baking temperature can be maintained during the baking process, directly influence the yield of the semiconductor devices. Therefore, a baking device having a precise temperature control and offering a quick temperature compensation is needed.

In a conventional bake chamber, as shown in FIG. 1, a wafer W is mounted on a hot plate 11 equipped within a chamber 10. Then the wafer W is heated to a constant temperature so as to fix a pattern. This process does not incur any problems in the general cases of forming patterns. However, a CD (Critical Dimension) defect may occur in the case of forming a contact hole having a small diameter or in the case of some photoresists that are especially sensitive to heat.

A present attempt to minimize such problems involves processing the inner surface of a cover 20 that faces the hot plate 11 in an oxide so as to roughen its surface. Roughening the surface of the cover 20 is aimed at scattering the heat from the hot plate 11 to thereby maintain the wafer at a uniform temperature. However, the temperature of the hot plate 11 nonetheless remains non-uniform and is lowest at a central portion thereof. Consequently, the CD of the photoresist pattern at the central region C of the wafer W (FIG. 2) is too low in comparison with the CD of the photoresist pattern at the other regions (T, L, R, F) of the wafer. Thus, the photoresist pattern will produce a defect when used to form a fine pattern in a subsequent process such as an etch process.

SUMMARY OF THE INVENTION

Therefore, an object of the present invention is to provide a baking apparatus for manufacturing semiconductor devices, wherein the processing atmosphere can be stabilized in a short time, a CD of a wafer baked in the apparatus will remain relatively uniform, and the baking process can be carried out in a short period of time.

In accordance with an aspect of the present invention, the baking apparatus for manufacturing semiconductor devices comprises a chamber containing a hot plate on which a wafer is to be mounted, a cover covering an upper part of the chamber, and a thin film extending over an inner surface of the cover which increases the rate of formation of a uniform temperature distribution in the chamber. Preferably, the thin film is made of material having a low emissivity ($\epsilon$), preferably in the range of 0.02~0.05. The inner surface is disposed face-to-face with the hot plate provided in the chamber.

The thin film may be formed discretely from the cover and adhered thereto, or may be produced in-situ on the inner surface of the cover. The surface of the thin film is preferably polished so as to be specular.

In particular, the thin film is made of material that is resistant against corrosion caused by organics. For example, the thin film is of aluminum, brass, copper, aluminum-plated copper, gold or silver.

BRIEF DESCRIPTION OF THE DRAWINGS

The above and other objects and features of the present invention will become apparent from the following description of preferred embodiments taken in conjunction with the accompanying drawings, in which:

FIG. 5 is a test table of CD data produced before and after using a thin film in accordance with the present invention.

DETAILED DESCRIPTION OF THE PREFERRED EMBODIMENTS

Figure 1:
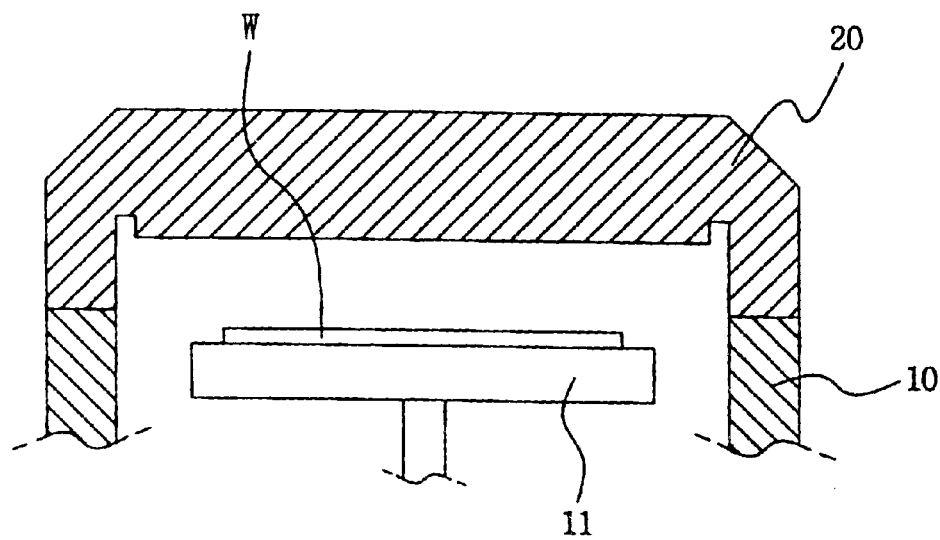
FIG. 1 is a sectional view of a conventional baking apparatus.
Figure 2:
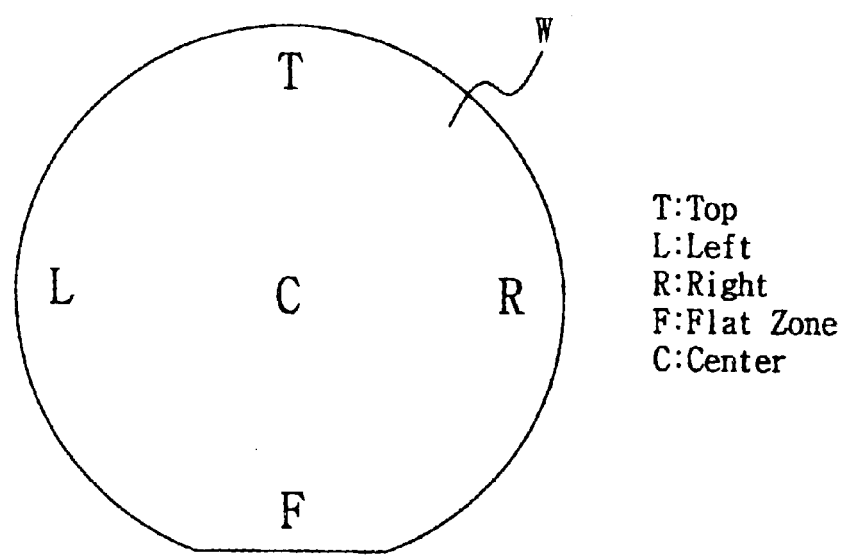
FIG. 2 is a plan view of a typical wafer.

Hereinafter, preferred embodiments of the present invention will be described in detail with reference to FIGS. 3 through 6. Like reference numbers/symbols designate like parts throughout the drawings.

Photolithographic equipment includes numerous processing units disposed in the neighborhood of a path along which a wafer is conveyed. Accordingly, the wafer can be transferred from the conveyance path to the respective units for the execution of respective processes.

For instance, the wafer is first transferred from a wafer carrier in the conveyance path to a HMDS (Hexa-Methyl Disilazane) unit by a main arm mechanism situated along the conveyance path. The wafer is adhesion-processed in the HMDS unit. Subsequently, the wafer is cooled to room temperature in a cooling unit. Then the wafer is transferred to a deposition unit. In the deposition unit, the wafer is fixed to a spin chuck, is rotated, and is sprayed in this state with photoresist solution such that a uniformly thick film of the photoresist is formed on the surface of the wafer.

The wafer is also transferred to a pre-bake unit so as to be soft-baked for a given time at about 100° C. At this time, solvent in the photoresist becomes volatile, whereby the layer of photoresist is stabilized. The wafer is again transferred to the cooling unit to be cooled to room temperature, and then is sent to a stepper. The photoresist film is exposed in the stepper.

Then the wafer is sent to a WEE (Wafer Edge Exposure) unit in which an edge portion of the wafer is exposed. Next, the exposed wafer is transferred to a PEB (Post Exposure Bake) unit to be baked at a constant temperature.

The baked wafer is transferred to the cooling unit. Once the wafer has been cooled, it is sent to a developing unit in which developing solution is sprayed onto the wafer, i.e., onto the photoresist that has been exposed. As a result, and depending on the properties of the photoresist, an exposed portion of the photoresist is removed and a non-exposed portion is left in a pattern, or the exposed portion is left in a pattern and the non-exposed portion is removed. Next, the developing solution remaining on the wafer is rinsed away by spraying pure water onto the wafer. Subsequently, the wafer is sent to a post bake unit.

In the post bake unit, the wafer is baked at a given temperature to harden the remaining photoresist and thereby ensure that it can endure subsequent processing. The thus-baked wafer is sent to the cooling unit to be cooled and is then unloaded using the wafer carrier.

The baking processes must be executed several times if a contact hole having the size required by the current demand for highly integrated semiconductor devices is to be produced. A unit for baking the wafer several times after the photoresist has been developed according to the present invention generally has the configuration shown in FIG. 3.

The baking unit includes a chamber 10 and a cover 20 covering an open upper end of the chamber 10 to seal the same. The cover 20 is made of the same material as the chamber 10. A hot plate 11 is disposed in the chamber 10, and a wafer W is mounted to an upper surface of the hot plate 11. The hot plate 11 is heated by a heater (not shown). Once the wafer W is mounted on the hot plate 11, the developed photoresist is baked to finalize the pattern of the photoresist, e.g., to finalize the size of an opening in the photoresist used to form a contact hole in an underlying layer.

The present invention is characterized by enhancing the cover 20, particularly, the inner circumferential surface of the cover 20. To this end, the inner surface of the cover 20 that faces the hot plate 11 is provided with a thin film 30 that is made of material having a low emissivity ($\epsilon$) in the vertical direction, i.e., in a direction perpendicular to the upper surface of the hot plate 11. Preferably, the emissivity ($\epsilon$) of the thin film 30 is within a range of 0.02~0.05. To this end, the surface of the thin film 30 is polished so as to be smooth. For example, the thin film 30 is made of aluminum in the form of a foil. The foil is adhered to the inner surface of the cover 20.

Figures 3, 4:
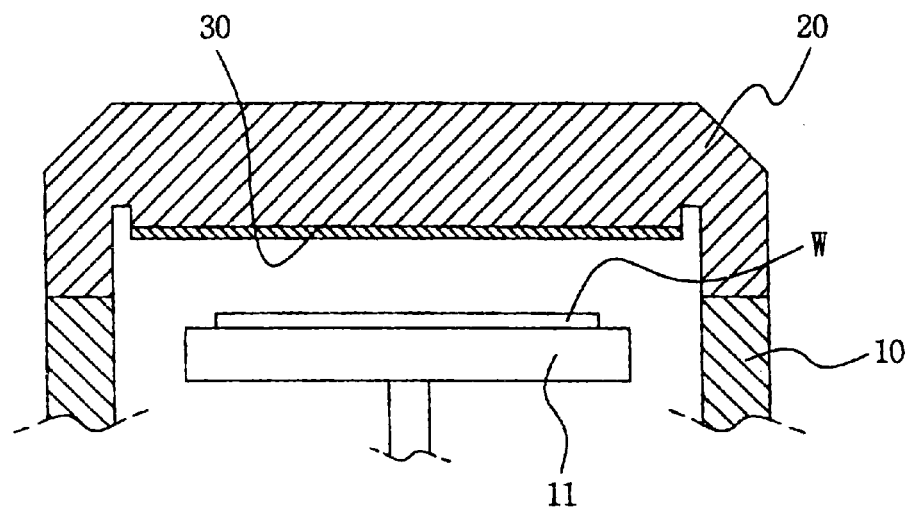
FIG. 3 is a sectional view of a baking apparatus according to the present invention.
FIG. 4 is a table showing a vertical emissivity of metals for use as a thin film according to the present invention.

FIG. 4 shows the emissivities of materials that are appropriate for the thin film 30 of the present invention.

Referring to FIG. 4, the emissivity of the aluminum which is oxidized, or whose surface is not polished and blunt, is higher than that of the aluminum that is well-polished (smooth). Therefore, well-polished aluminum should be used for the film 30. However, as FIG. 4 shows, brass, copper or gold can be used, wherein such materials can also be well-polished.

The thin film 30 may be separately manufactured and adhered to the inner surface of the cover 20, or may be formed in-situ on the cover 20 through a method such as a plating followed by polishing. In addition, the thin film 30 is preferably made of material that is strongly resistant to corrosion by organics such as photoresist.

Figure 6:
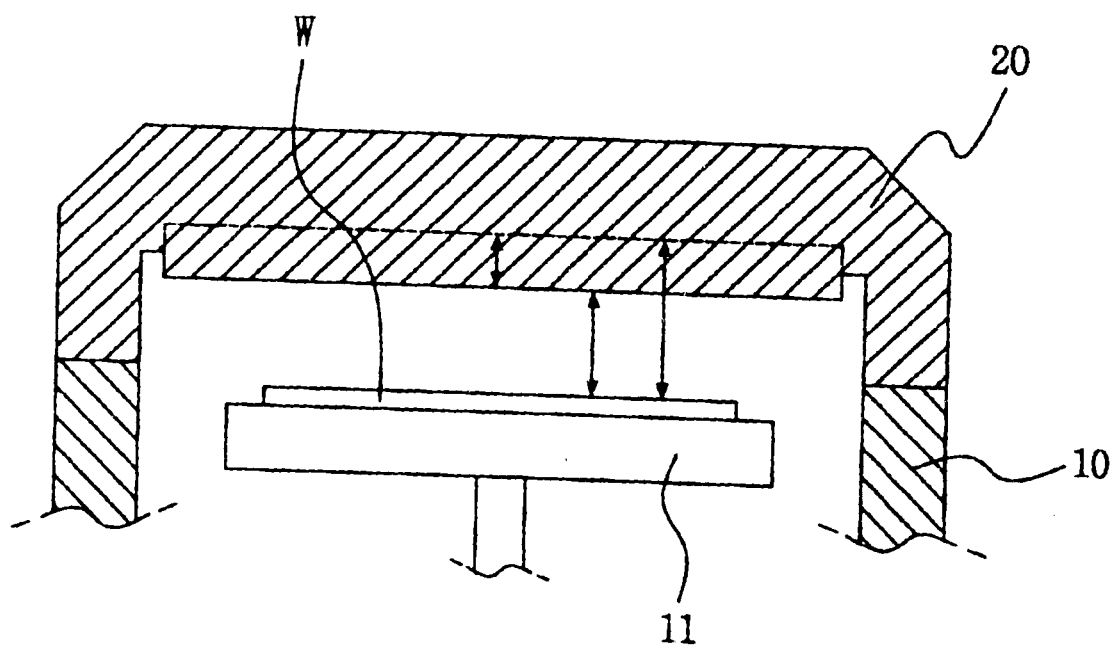
FIG. 6 is a sectional view of a baking apparatus used to carry out testing in connection with the present invention.

Tests were conducted to confirm that variations in the CD of the photoresist pattern can be attributed to the material of the inner surface of the cover 20 that radiates heat, rather than the structure of the cover 20. In this respect, FIG. 5 illustrates CD data obtained from wafers W that were baked in respective apparatus. With reference to FIG. 5, 'the existing' condition refers to a case in which the inner surface of the cover 20 confronting the hot plate 11 is oxidized so that the surface is fairly rough, 'the structural change' condition refers to a case in which the distance between the hot plate 11 and the inner surface of the cover 20 as shown in FIG. 6 is improved, and the 'AL tape' condition refers to a case in which the inner surface of the cover 20 is taped with aluminum.

As can be readily seen from such CD data, the CD varied the least throughout the wafer in the case of the aluminum tape, namely in the case where the material having a low emissivity was disposed over the inner surface of the cover 20 from which heat normally would radiate toward the wafer. Simple structural changes involving the surface did not influence the variations in the CD much. Also, tests in which the color of the inner surface of the cover 20 was changed showed that the color of the surface never influences the CD of the pattern at various regions of the wafer.

As was described above regarding the results of various tests conducted in connection with the invention, the greatest influences on the CD of a pattern on a wafer are the material at the inner surface of the cover 20 that faces the hot plate 11, and the roughness of the material. Thus, the thin film 30 is made of material having a low emissivity, e.g., aluminum, copper, brass, gold or even silver, and the surface of the thin film 30 is polished so as to be remarkably smooth.

As a result, the interior process atmosphere of the baking apparatus can stabilize at a constant temperature more rapidly. In other words, the thin film 30 increases the rate of formation of a uniform temperature distribution in the chamber. As a result, the baking process can be carried out in a relatively short amount of time, the CD is more uniform across the wafer, and the number of defective products can be minimized.

Finally, although the present invention was described in detail above in connection with the preferred embodiments thereof, the scope of the invention is not so limited. Rather, various changes and modifications of the preferred embodiments, as will become apparent to those of ordinary skill in the art, are seen to be within the true spirit and scope of the invention as defined by the appended claims.

What is claimed is:

1. A baking apparatus for use in baking semiconductor wafers, said apparatus comprising:

a chamber having an open upper part, and a hot plate disposed in said chamber and configured to support a wafer thereon;

a cover covering the upper part of said chamber and sealing said upper part, said cover having an inner surface spaced above and confronting said hot plate; and a film extending over and integral with the inner surface of said cover which increases the rate of formation of a uniform temperature distribution in the chamber.

2. The apparatus of claim 1, wherein said film is a film of material having a polished surface facing said hot plate.

3. The apparatus of claim 2, wherein said film comprises a material selected from the group consisting of aluminum, brass, copper, gold and silver.

4. The apparatus of claim 1, wherein said film comprises a material selected from the group consisting of aluminum, brass, copper, gold and silver.

5. The apparatus of claim 1, wherein said film consists of material having an emissivity of 0.02~0.05.

6. A baking apparatus for use in baking semiconductor wafers, said apparatus comprising:

a chamber having an open upper part, and a hot plate disposed in said chamber and configured to support a wafer thereon;

a cover covering the upper part of said chamber said cover having an inner surface confronting said hot plate; and a film of metal extending over the inner surface of said cover, said film having a polished surface facing said hot plate, whereby the film increases the rate of formation of a uniform temperature distribution in the chamber.

7. The apparatus of claim 6, wherein said film comprises a material selected from the group consisting of aluminum, brass, copper, gold and silver.

8. A baking apparatus for use in baking semiconductor wafers, said apparatus comprising:

a chamber having an open upper part, and a hot plate disposed in said chamber and configured to support a wafer thereon;

a cover covering the upper part of said chamber said cover having an inner surface confronting said hot plate; and a film extending over the inner surface of said cover, said film comprising a material selected from the group consisting of aluminum, brass, copper, gold and silver, whereby the film increases the rate of formation of a uniform temperature distribution in the chamber.

9. A baking apparatus for use in baking semiconductor wafers, said apparatus comprising:

a chamber having an open upper part, and a hot plate disposed in said chamber and configured to support a wafer thereon;

a cover covering the upper part of said chamber said cover having an inner surface confronting said hot plate; and a film extending over the inner surface of said cover, said film consisting of material having an emissivity of 0.02~0.05, whereby the film increases the rate of formation of a uniform temperature distribution in the chamber.

* * * * *